United States Patent [19]

Chen

[11] 4,096,580

[45] Jun. 20, 1978

[54] MULTIPLE REDUNDANCY LOOP BUBBLE DOMAIN MEMORY

[75] Inventor: Thomas T. Chen, Yorba Linda, Calif.

[73] Assignee: Rockwell International Corporation, El Segundo, Calif.

[21] Appl. No.: 708,806

[22] Filed: Jul. 26, 1976

[51] Int. Cl.² .............................................. G11C 19/08
[52] U.S. Cl. .......................................... 365/1; 365/15
[58] Field of Search ................. 340/174 TF; 365/1, 15

[56] References Cited

U.S. PATENT DOCUMENTS

| | | | |
|---|---|---|---|
| 3,921,156 | 11/1975 | Yoshimi | 340/174 TF |
| 3,990,058 | 11/1976 | Archer et al. | 340/174 TF |
| 4,001,673 | 1/1977 | Barrett et al. | 340/174 TF |

OTHER PUBLICATIONS

IEEE Transactions on Magnetics - vol. Mag-10; Sep. 1974, pp. 856–859.
IBM Technical Disclosure Bulletin - vol. 16, No. 6, Nov. 1973, pp. 1807–1808.

*Primary Examiner*—James W. Moffitt
*Attorney, Agent, or Firm*—H. Fredrick Hamann; G. Donald Weber, Jr.

[57] ABSTRACT

This invention relates to an improved network and technique for correcting bubble domain memories of the major/minor loop type. In particular, a selectively insertable correction loop can be provided in a major loop path to insert or remove blank bits so that the effect of defective minor loops can be overcome. The correction networks include propagation loops formed of conventional magnetic bubble domain device elements and a conductor which is selectively alterable to provide a bypass or insertion mode of operation for the correction loop relative to the major loop.

10 Claims, 2 Drawing Figures

MULTIPLE REDUNDANCY LOOP BUBBLE DOMAIN MEMORY

BACKGROUND

1. Field of the Invention

This invention relates to magnetic bubble domain systems, in general, and to an improved major/minor loop arrangement, in particular.

2. Prior Art

Magnetic bubble domain devices are being utilized to perform many functions in the handling of data. Many devices and systems are being used and explored. It has been determined that one of the primary utilizations for magnetic bubble domain systems is in large memory systems. One of the foremost memory organizations is the major/minor loop type of bubble domain memory chip organization. One of the advantages of this organization is that it has a built-in redundancy capability in that a plurality of minor loops are provided to interact with a single major loop. This redundancy is important in that, if there are a few defective minor (storage) loops in the chip, the defects can be ignored or overcome by avoiding these defective loops. Thus, it is not essential to produce a memory chip which is absolutely perfect. Consequently, the processing yields for this type of memory can be greatly improved.

In the past, to effect this type of system, the bubble domain memory chips have been tested and sorted to determine which chips and which loops on each chip are satisfactory or defective. Typically, when the testing has been completed, the chips have been subjected to "on-chip" modifications wherein loop structures have been physically altered (e.g. elements etched off) to remove the loops from the operative circuit. In addition, or in the alternative, systems requiring special electronic controls to handle the input and output data can be utilized. That is, electronic control systems keep track of the information to be stored in the memory and remember when information to or from a defective loop would be provided. Basically, this electronic "off-chip" correction incorporates a large memory system and the like. In addition, for large multi-tiered memories, highly inefficient operation is achieved. This type of system is defined in "Fault-Tolerant Memory Organization: Impact on Chip Yield and System Cost", Naden et al, IEEE Trans. MAG.-10, 1974, pp 852–885. The difficulty and complexity in producing such systems are great as is well known. Therefore, it is desirable to avoid this complex arrangement. However, to date, no solution is possible other than the difficult and complex as well as energy and space consuming concept noted above.

SUMMARY OF THE INVENTION

In this invention, a major loop path is associated with a plurality of minor loop paths, some of which may be defective. An input/output path is provided. The input/output path is coupled to the major loop path via exchange switches. The major loop path is coupled to storage loops by respective universal switches. A plurality of correction loops is provided adjacent to the major loop path. Typically, the correction loops are located in the vicinity of the exchange switches which couple the major loop path to the input/output path. The correction loops are controlled, for example by the application of a current signal to a conductor. By selectively altering the configuration of the conductor, the correction loops can be controlled so as to insert (or not) additional path structures in series with the major loop path to control the information handled by the system.

DESCRIPTION OF A PREFERRED EMBODIMENT

Figure 1:
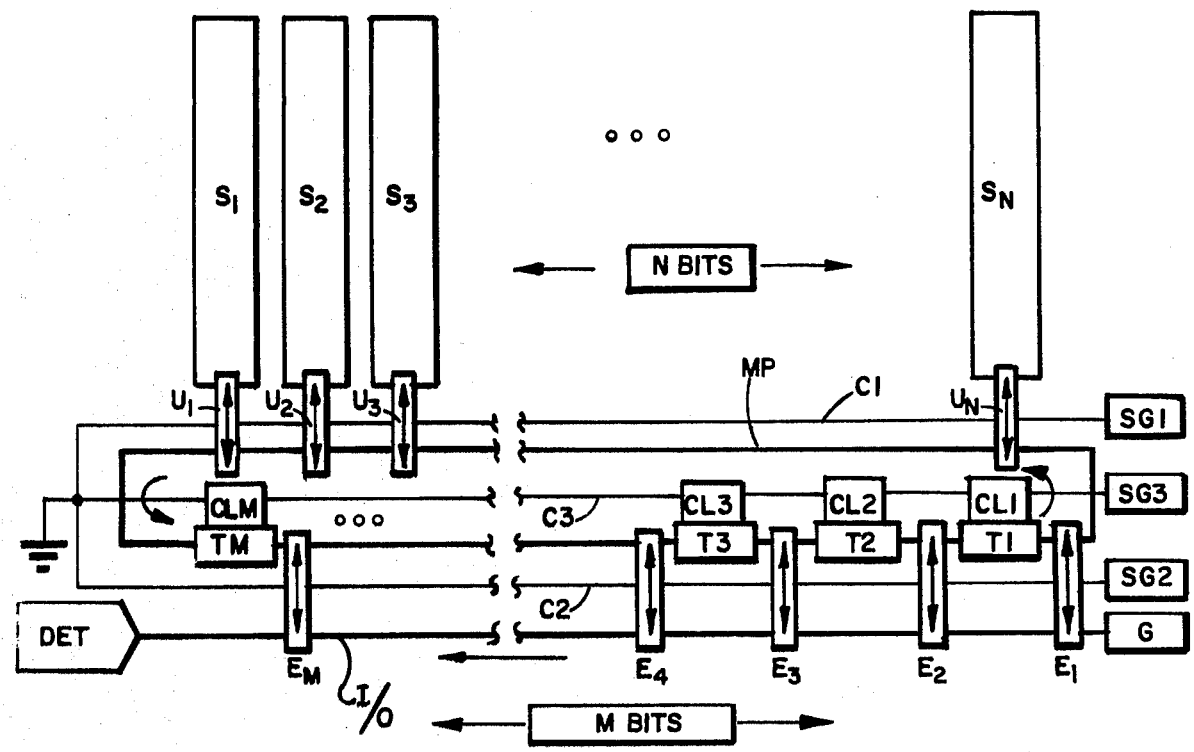
FIG. 1 is a schematic representation of an improved major/minor loop memory system including the instant invention.

Referring now to FIG. 1, there is shown a schematic diagram of a system using the improvement of the instant invention. The system uses, generally, the arrangement of a standard major/minor loop chip organization. However, the system arrangement described in the copending application of Chen and Steury entitled Data Storage System, bearing Ser. No. 688,670, filed on May 21, 1976 and assigned to the common assignee can also be used. Thus, a plurality of N storage loops S1, S2, S3 ... SN is provided. Each of these storage loops can be fabricated in a suitable manner known in the art. Major path MP is provided adjacent to all of the storage loops. One of N switches, such as universal switches U1, U2, U3 ... UN of the type, for example, described in copending application of Chen et al entitled Data Processing Switch, bearing Ser. No. 688,651, filed on May 21, 1976, and assigned to the common assignee, is used to couple respective storage loops to the major path. Input/output path I/O is provided adjacent to another portion of major path MP. Generator G is connected to one portion of path I/O. Detector DET is connected to another portion of path I/O. A plurality of exchange switches, of known configuration, such as switches E1, E2, E3 ... EM is arranged to provide coupling between path I/O and major path MP. Suitable conductors C1 and C2 are coupled to signal generators SG1 and SG2. The signal generators selectively supply a current pulse to conductors C1 and C2, respectively, in order to control the operation of the associated switches such that they are selectively operable to exchange information between the respective circuit paths.

Associated with major path MP are a plurality of transfer switches T1, T2, T3 ... TM. The transfer switches are, generally, interspersed in an alternating relationship, between exchange switches, E1, E2 and so forth. Coupled to the transfer switches T1-TM are respective correction loops CL1-CLM. Conductor C3 is associated with each of the correction loops CL1-CLM. Conductor C3 is connected to receive a current signal from signal generator SG3 to provide selective operation of the correction loops. As will be described more fully, the value of M is less than or equal to N and is determined by the number of operative (M) storage loops and the number of defective (N-M) storage loops.

Figure 2:
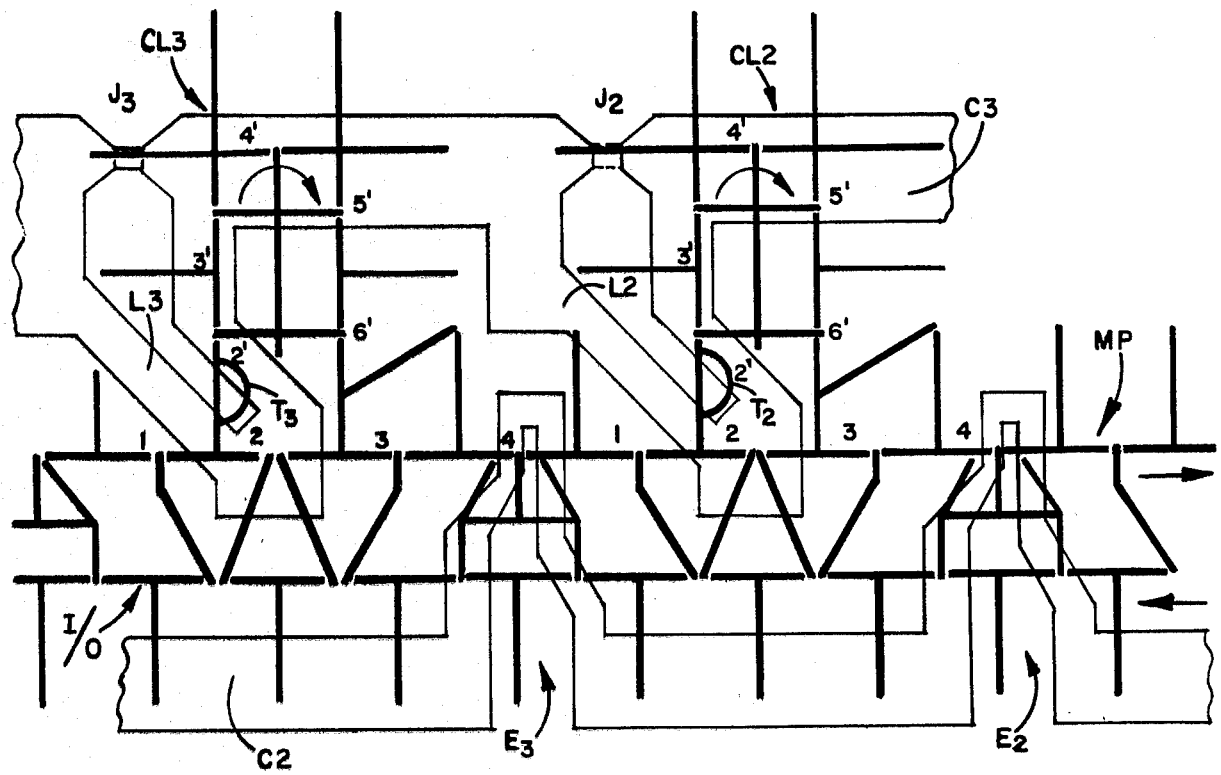
FIG. 2 is a schematic representation of one embodiment of the instant invention.

Referring now to FIG. 2, there is shown, in more detail, a schematic diagram of one embodiment of the instant invention. In particular, input/output path I/O is represented by the bottom-most row of T-bars. In path I/O, magnetic bubble domains propagate from right to left. Exchange switches E1 and E2 are shown. These exchange switches are representative of the invention and are not limitative. Details of the switch and the operation thereof are described in the copending application entitled Compact Exchange Switch for Bubble Domain Devices by Chen et al, bearing Ser. No. 688,652, filed on May 21, 1976, and assigned to the common assignee. This copending application is incorporated herein by reference.

Major path MP is represented by the inverted T-bar row which is coupled to exchange switches E1 and E2 and, as well, to path I/O via the various device structures shown. Conductor C2, associated with exchange switches E1 and E2, selectively receives a control signal from the appropriate signal generator to transfer, or exchange, information in the form of magnetic bubble domains from path I/O to path MP and vice versa.

Also, coupled to path MP are correction loops CL2 and CL3 which comprise a plurality of typical magnetic bubble domain device structures such as T-bars, I-bars and the like. These structures form a correction loop which is of the appropriate length to effect the equivalent distance between adjacent, consecutive storage loops (see FIG. 1). Transfer switches T2 and T3 form a portion of the respective correction loops. The transfer switches T2 and T3 can be any suitable switches. The switches shown here are modified versions of the dollar sign switch which is known in the art. Conductor C3, as shown, includes loops L2 and L3 which surround the respective transfer switches. In addition, each loop has a shortcircuiting member, such as J2 or J3, which is disposed across the base of the loop which surrounds the respective transfer switch. This shortcircuiting member is, typically, narrower than the conductor C3 so that it may be readily removed or severed. However, excessive current restriction should be avoided in designing this junction. When the shortcircuiting member, J, is intact, the loop, L, around the respective transfer switch is shortcircuited. Thus, little or no current traverses the conductor loop and the loop has no significant effect on the system. However, when the shortcircuiting member, J, is severed, the loop around the respective transfer switch is functional and current exists in the loop. This current operates to affect the operation of transfer switch TI and correction loop CLI.

In describing the operation of the instant invention, concurrent reference is made to FIGS. 1 and 2. Initially, as shown in FIG. 1, there is provided substantially a major/minor loop structure. A plurality of N storage loops S1-SN are provided. However, as frequently happens, one or more of these loops may be defective. Provided the number of defective loops is relatively small (typically about 10% of the number of loops) and the remainder of the system is functional, a utilizable chip is still obtainable. In other words, the chip need not be discarded merely because of a small number of defective storage loops.

In the instant system, bubble domains are supplied by application of the appropriate signal at generator G. The bubbles propagate along path I/O toward detector DET, viz. right to left in FIG. 1. Inasmuch as the chip has been probed, tested and so forth, the number of operable storage loops has been identified as M. It is understood that N is greater than or equal to M. Consequently, useful information forming a data block of M bits is provided along path I/O.

When the M bits of information are provided along path I/O and are in appropriate locations, a signal is supplied along conductor C2 by signal generator SG2 whereby exchange switches E1-EM are activated. The M bits are then transferred to major path MP. The bubbles in path MP then propagate along the lower track thereof from left to right as suggested by the arrow.

Typically, M bits of information would then be transferred to and circulated through path MP and selectively transferred to the respective storage loops. However, inasmuch as there are N storage loops and only M bits, appropriate account must be made of the bit positions represented by the defective loops. To provide this correction factor, the correction loops, CLi, such as CL2 and CL3, (seen best in FIG. 2), are provided. The correction loops are rendered selectively operable by altering conductor C3 which is associated therewith. That is, as discussed supra, conductor C3 has a major portion which extends along the length of the system as suggested by the long axis of major path MP. In addition, conductor C3 has loops which are substantially perpendicular to the main extent thereof and which extend around the magnetic device structures as shown in FIG. 2. Shortcircuiting member J is provided to interconnect the various elongated portions of conductor C3 and to short circuit the loops thereof. However, with the removal of the shorting element J, (for example, see shorting element J2 which has been removed) conductor C3 includes the loop portion which surrounds the correction loop elements including transfer switch T2. Thus, as the M bits propagate along the lower track of path MP, typical operation occurs. Moreover, in the area where shorting element J3 has not been removed, the loop of conductor C3 has little or no effect wherein propagation of the bubble continues along the path suggested by locations, 1, 2, 3, 4 and so forth in FIG. 2. However, with the removal of the shorting element, J2, the current applied to conductor C3 produces a field which diverts the bubble propagation. In this case, the bubble follows path 1, 2', 3', 4', 5', 6', 3, 4 and so forth. This correction loop is defined to have a length which is equivalent to the distance between storage loops in the circuit. In the arrangement illustrated in FIG. 2, the minor loops are spaced apart by the equivalent of four periods. Therefore, each bit is separated by four cycles of HR. Therefore, the correction loop must be a multiple of 4. If the correction loop is limited to only four periods (as shown), only a single loop correction can be effected. In order to correct for consecutive defective loops, the correction loop should be expanded to eight periods and so forth. The optimum correction loop size is, thus, a function of the distribution of loop defects. Consequently, when a defective storage loop has been discovered and shorting junction J has been removed, the correction loop CL has the effect of inserting a blank or "binary zero" into the bubble domain bit train. Consequently, as the bubbles propagate around path MP toward the upper track, the net effect is that the M bits have been expanded to represent N bits with a blank or binary zero at each of the locations which interface with a defective storage loop.

Consequently, with the application of the current signal by signal generator SG1 along conductor C1, N bits are effectively exchanged from path MP to storage loops S1-SN. Of course, the defective storage loops will not return any signals to path MP because no signals can be propagated therethrough.

The readout operation is substantially similar to the aforesaid operation. That is, in response to a signal from signal generator SG1 via conductor C1, N bits of information are transferred from storage loops S1-SN via universal switches U1-UN to the upper track of major path MP. These bubbles propagate around path MP in the counterclockwise direction. Again, because of the correction loops, some of the N bits are shunted aside into the correction loops whereby only the M bits of information are transferred to path I/O in response to a current signal from signal generator 2.

The circuit configuration shown in FIG. 2 is illustrative of one possible arrangement. This arrangement is not intended to be limitative of the invention. However, as suggested, the initial bubbles propagated along path I/O which is formed of T-bar conductors in the direction suggested by the arrow. Upon application of a signal from signal generator SG2 to conductor C2, bubbles from path I/O are selectively transferred via the exchange switches E1, E2 and the like to the bottom track of path MP which is also formed, generally, of T-bar elements.

In those correction loops where the shorting junction J is removed, conductor C3 forms a loop around the correction loop elements which are largely T and I-bar elements. Modified T-bar elements are included at the upper portion thereof to permit the bubbles to turn corners rapidly. Other transitional corner devices shown and described in the copending application entitled Multiple Loop Shift Register Having Redundancy, bearing Ser. No. 499,718, by J. L. Archer et al, now U.S. Pat. No. 3,990,058 and assigned to the common assignee. This copending application is incorporated herein by reference. Perhaps the most important element in this correction loop is the transfer switch T2 or T3 which is intended to be a unilaterally operable element. This switch device is a modification of the known dollar sign switch (see IEEE Trans. on Magnetics, Vol. MAG-9, No. 3, Sept. 1973, p. 285). This new switch may be termed the "half-dollar" switch. The unilateral operation of the "half-dollar" switch is readily apparent.

Thus, there is shown and described an improved major/minor loop chip organization. The improvement permits a relatively simple modification to the chip to overcome the effect of defective minor or storage loops in the system. This improved apparatus provides a simple, relatively inexpensive and uncomplicated procedure for "on-chip" circuit correction. A preferred device or element arrangement for a correction loop is also described. It is understood that correction loops of different arrangement or configuration can be utilized as well. Any such correction loops which fall within the purview of this description are intended to be included therein as well. The preferred embodiment is not intended to be limitative of the inventive concept. The scope of the invention is to be determined by the appended claims.

Having thus described the preferred embodiment, what is claimed is:

1. A magnetic bubble domain system comprising,
    a primary propagation path for magnetic bubble domains,
    a plurality of $n$ secondary propagation paths for magnetic bubble domains selectively coupled to said primary propagation path for transferring magnetic bubble domains therebetween,
    said secondary propagation paths coupled to said primary propagation paths at locations which are separated by a prescribed distance,
    a plurality of $m$ correction loops associated with said primary path where $m$ is less than or equal to $n$,
    each of said correction loops having a length which is equivalent to an integral multiple of said prescribed distance between said secondary propagation paths,
    said correction loops capable of propagating magnetic bubble domains, and
    conductor means associated with said primary propagation path and said correction loops,
    said conductor means including at least two electrically parallel portions arranged such that, in response to an applied current signal, one of said parallel portions selectively causes magnetic bubble domains in said primary path to traverse an associated correction loop only when the other of said parallel portions is selectively removed from said conductor means,
    whereby said primary propagation path is effectively elongated by the addition of one or more correction loops when one or more of said secondary propagation paths is defective and the integrity of information on said primary propagation path is preserved.

2. The magnetic bubble domain system recited in claim 1 including
    transfer switch means associated with each of said correction loops and said primary path,
    said transfer switch means operable to selectively transfer bubble domains from said primary path to appropriate ones of said correction loops as a function of the condition of said conductor means.

3. The magnetic bubble domain system recited in claim 1 wherein
    at least one of said two electrically parallel portions of said conductor is of reduced width to facilitate the physical removal thereof from the circuit.

4. The magnetic bubble domain system recited in claim 1 including
    input/output propagation path means,
    first switch means for selectively transferring magnetic bubble domains from said input/output propagation path means to said primary path,
    second switch means for selectively transferring magnetic bubble domains from said primary path to said plurality of secondary propagation paths, and
    means for supplying control signals to each of said first and second switch means to control the operation thereof.

5. The magnetic bubble domain system recited in claim 4 including
    generator means, and
    detector means,
    said generator means and said detector means coupled to said input/output propagation path means.

6. The magnetic bubble domain system recited in claim 4 wherein
    said second switch means ia a unilaterally operable transfer switch.

7. The magnetic bubble domain system recited in claim 6 wherein
    said second switch means comprises one-half of a dollar sign switch.

8. The magnetic bubble domain system recited in claim 1 including
    current signal supplying means coupled to said conductor means to selectively supply a current signal thereto.

9. The magnetic bubble domain system recited in claim 1 wherein
    at least one of said $n$ secondary propagation paths is defective and at least $m$ of said secondary propagation paths are operative to receive magnetic bubble domains, and said other of said parallel portions of said conductor means is removed from the conductor means associated with *n-m* correction loops.

10. The magnetic bubble domain system recited in claim 1 wherein said one parallel portion of said conductor means comprises an extended loop which encompasses at least a portion of the associated correction loop, and said other of said parallel portions of said conductor means providing an interconnection across said extended loop.

* * * * *